United States Patent [19]

Kasday

[11] Patent Number: 4,484,179

[45] Date of Patent: Nov. 20, 1984

[54] TOUCH POSITION SENSITIVE SURFACE

[75] Inventor: Leonard R. Kasday, Plainsboro, N.J.

[73] Assignee: AT&T Bell Laboratories, Murray Hill, N.J.

[21] Appl. No.: 333,744

[22] Filed: Dec. 23, 1981

Related U.S. Application Data

[63] Continuation of Ser. No. 140,715, Apr. 16, 1980, abandoned.

[51] Int. Cl.³ .................................................. G08C 9/00
[52] U.S. Cl. .................................. 340/365 P; 178/18; 250/549; 340/712
[58] Field of Search ............... 340/365 P, 712, 815.24, 340/815.31; 178/18; 250/549

[56] References Cited

U.S. PATENT DOCUMENTS

| | | | |
|---|---|---|---|
| 2,227,083 | 12/1940 | Handrick | 178/18 |
| 3,271,515 | 9/1966 | Harper . | |
| 3,526,775 | 9/1970 | Friedrich et al. | 340/365 P |
| 3,621,268 | 11/1971 | Friedrich et al. . | |
| 3,673,327 | 6/1972 | Johnson et al. | 340/712 X |
| 3,707,715 | 12/1972 | Perotto | 340/365 P |
| 3,764,813 | 10/1973 | Clement et al. . | |
| 3,775,560 | 11/1973 | Ebeling et al. . | |
| 3,846,826 | 11/1974 | Mueller . | |
| 4,177,354 | 12/1979 | Mathews . | |
| 4,180,702 | 12/1979 | Sick et al. . | |
| 4,198,623 | 4/1980 | Misek et al. . | |

OTHER PUBLICATIONS

D. Brini, L. Pell, O. Rimondi, P. Veronesi, "On Large Scintillation Counters", Supplemento al vol. II, Serie X, Del Nuovo Cimento, N. 4, 1955, 20 Semestre, pp. 1062-1069.

Primary Examiner—David L. Trafton
Attorney, Agent, or Firm—David H. Tannenbaum

[57] ABSTRACT

A touch sensitive device is arranged with substantially parallel surfaces which are at least partially transparent to light. A flexible membrane is supported above the top surface of the screen and when the overlay is flexed into contact with the screen, light which had passed through the screen, is trapped between the screen surfaces by total internal reflection. The edges of the screen are fitted with light detectors for gathering the trapped light. Using this arrangement positional determination of one or more screen touches is possible.

30 Claims, 9 Drawing Figures

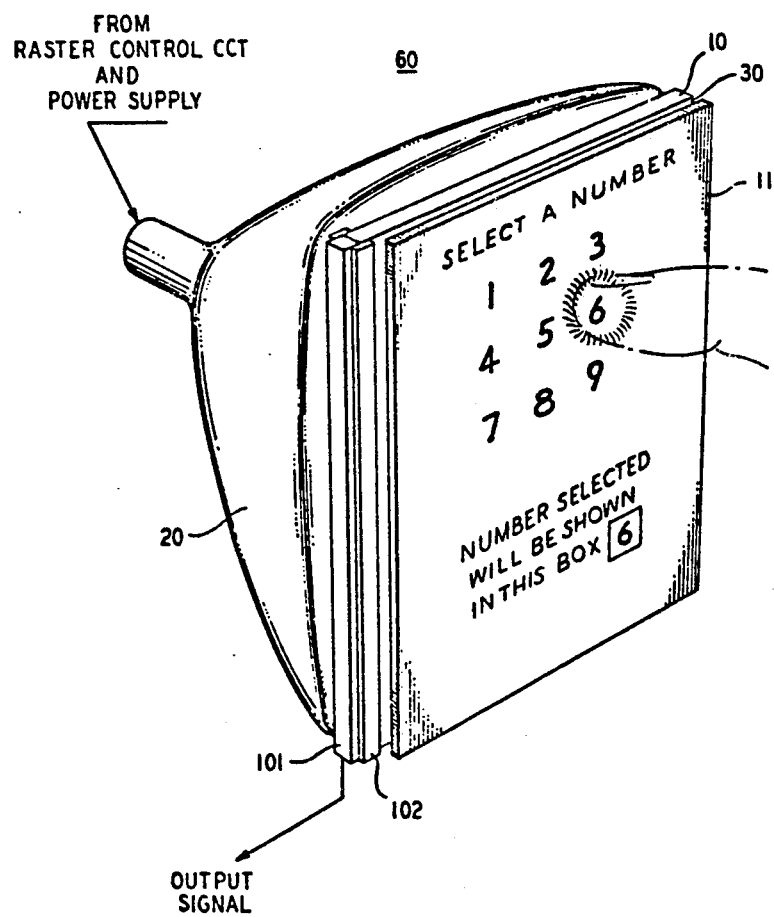

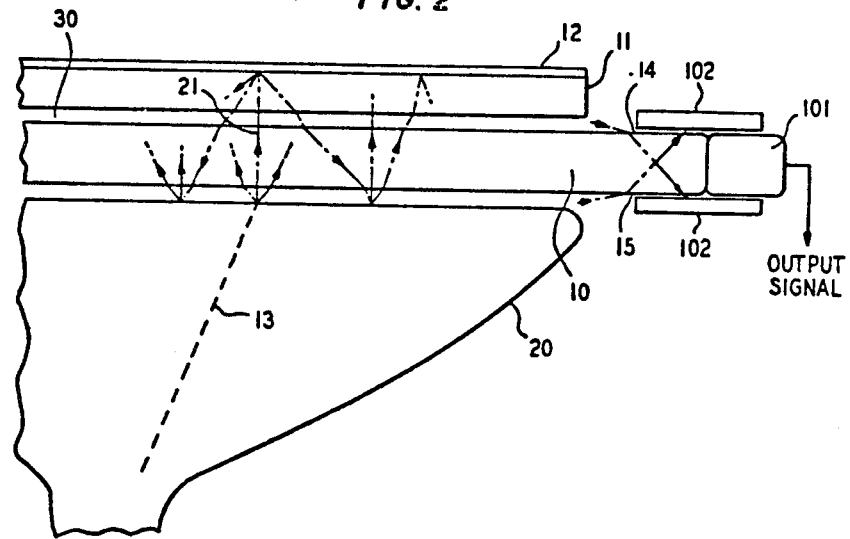
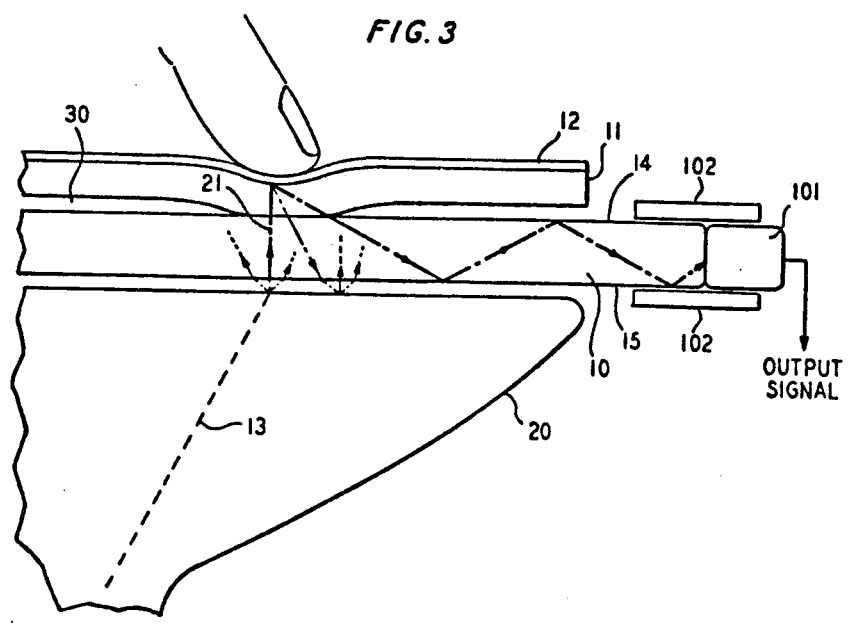

TOUCH POSITION SENSITIVE SURFACE

This is a continuation of application Ser. No. 140,715 filed Apr. 16, 1980, now abandoned.

FIELD OF THE INVENTION

This invention relates to a device for determining the position of a surface contact and more particularly to a touch sensitive device for use with a synchronized light source, such as a cathode ray tube (CRT).

BACKGROUND OF THE INVENTION

There are many applications where it is desired to provide feedback information for information displayed on a CRT screen. For example, it has become common practice with the use of computers to display on the screen a choice for the user to select from. The user is typically instructed to operate specific keys, on a keyboard or similar device, to select from among a menu of possible choices. In response to the user operating the selected key the menu is changed and the user is given a new choice, again making the choice by operating a particular key. Such an arrangement is tedious since a user must first lock at the screen and then go to a separate keyboard to find the proper key. This is time consuming and requires costly separate equipment.

One possible solution to the problem has been to arrange the menu of choices along a side of the viewing screen and to arrange next to the screen a series of buttons. As the labels on the screen change the buttons become dynamically relabeled. While this solves some of the problems it does not allow for complete flexibility of the visual display and still requires an artificial arrangement of the display.

Several attempts have been made to solve the problem, one such being the use of a light pen which is held over the point on the CRT screen corresponding to the desired response. Light from the CRT raster then enters the pen and the position of the raster is determined by coordinating the signal output from the pen with the position on the raster at the time of the signal. This arrangement, while performing properly, has the disadvantage of requiring the user to hold a pen and to properly direct the pen to the proper place on the screen.

Other touch sensitive screens used crossed wires, crossed beams of infra red light, reflection of acoustic surface waves, current division in resistive sheets, force balancing, or mechanical buttons on which a display image was superimposed by a half silvered mirror. When used with a CRT display, the foregoing methods require careful calibration to establish correspondence between points on the touch screen and poins on the display. The need for special transducers or many electrical connections increase complexity and cost. Also, most of the methods only allow activation of one point at a time.

Thus, it is desired to solve these problems in a manner which allows the visual display to be touched directly at any location on a dynamically changing basis with the position of the touch being easily determinable. These problems must also be solved in a manner which allows for fingers of varying degrees of dampness and for the use of screens in ambient light conditions which vary considerably from place to place.

SUMMARY OF THE INVENTION

Advantage is taken of the fact that the CRT raster is a synchronized signal, the position of which is known at any point in time. I have overlaid the CRT screen with a device having parallel surfaces, such as a glass plate, through which light generated by the raster is visible to the user. The edges of the device are fitted with photodiodes which respond to the entrapment of light between the parallel surfaces to provide an output. By touching the top surface of the device (i.e., changing the medium bounding the surface) at a point, the light from the CRT screen surface becomes entrapped within the device by total internal reflection.

One problem which must be addressed in designing such a touch sensitive screen is the matter of reflectivity as it affects output light levels. The problem is manifest in situations where the photodiode coupling at the side of the screen is incapable of distinguishing between a touch and a non-touch in the presence of background noise, or build-up of oils on the screen surface. I have solved this problem by overlaying the top surface of the device with a flexible membrane separated from the device by a small air gap. The membrane has a half tone pattern of small white dots on its upper surface so as to partially reflect the light from the CRT. (Other patterns such as strips could also be used). However, as long as the air gap remains between the device and the overlay membrane, the refraction angle in the glass is such as to prevent total internal reflection from occurring between the surfaces of the device.

When a user presses the membrane it is deflected to make intimate contact with the top surface of the device thereby removing the air gap and allowing the reflective rays of light to reenter the device and become entrapped therein by total internal reflection. This trapped light then travels to the sides of the device where the photodiodes detect the entrapment. By coordinating the time of the changed photodiode output with the CRT raster position the exact surface position of the touch is determinable.

Another use of this device is to visually verify the proper placement of a movable member. In such an environment a fixed light source would be used and the member brought into contact with the membrane. When the member was positioned properly total internal reflection would occur and light would be seen emerging from the edge of the device

BRIEF DESCRIPTION OF THE DRAWING

These attributes of my invention as well as others will be more fully appreciated from a review of the drawing in which:

FIG. 1 shows a pictorial view of a CRT screen overlaid by my device;

FIG. 2 is a schematic representation showing the device with the flexible overlay membrane, the overlay being in the relaxed position;

FIG. 3 shows my device with the membrane being deflected into contact with the top parallel surface;

DETAILED DESCRIPTION

Figure 4:
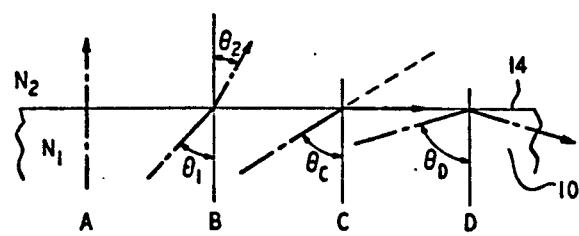
FIGS. 4 and 5 show the principles on which my invention is based.

As shown in FIG. 1, CRT screen 20 is arranged in the well known manner such that electrons from the electron gun (not shown) impinge upon the phosphorescent screen of the CRT in a sequential pattern, line by line, from top to bottom. As the electrons hit the phosphorescent surface the surface glows. Phosphorescent images can thus be formed on the screen under control of the electron beam. This phenomenon, of course, is now well known and forms the basis of television and other CRT systems.

By properly programming the system it is possible to have any type of image displayed at any position on the screen for any length of time. Thus, it is possible to create images representative of numbers, sets of numbers, letters, or signals in any position on the face of CRT 20, as shown. Using my device, which is a continuation of elements 10 and 11 of system 60, it is possible to allow a user to touch any position on the device and to determine electronically the position of the touch. In order to accomplish this, I have overlaid the CRT screen with device 10 having parallel surfaces through which light from the phosphorescent screen may pass. I have overlaid device 10 with flexible membrane 30 which advantageously may be transparent silicone rubber.

Membrane 11 is separated from top surface of device 10 by any one of several means as, for example, stretching between supports or resting against ridges, protrusions, or flexible tabs dispersed about the surface. The flexible membrane is constructed with a half tone white dot pattern on its outer surface (other patterns such as strips could also be used). This construction allows light from the CRT screen to pass through the membrane to be viewed by a user as well as being reflected back towards the CRT screen. When the CRT screen projects an image calling for user response, a finger or other device is placed against the outer surface of the membrane at the position selected (the number 6 in FIG. 1). When this occurs, as will be explained from that which will follow, light becomes trapped within device 10. This trapped light travels to the edge of the device and is detected by photodiodes 101 thereby providing an output signal useable for determining the position of the touch. The actual determination of the touch position is accomplished by coordinating the position of the CRT raster beam with the time of the output signal. This coordination and determination is the subject of concurrently filed copending U.S. patent application of S. W. Bell, R. L. Breeden and M. J. Sabin, Ser. No. 140,715 which application is hereby incorporated by reference herein as though fully reproduced in this application.

Figure 7:
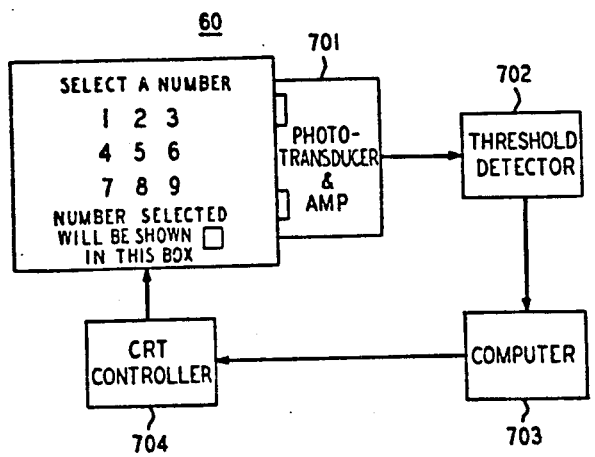
FIG. 7 shows another block diagram of a system similar to "light pen" system.

The coordination and determination can also be done by the system shown in FIG. 7, which is similar to that used for light pens. This system can detect more than one touch at a time. This results from the fact that the computer can use the threshold detector outputs to record all times that an output signal is received from the photodetectors and amplifiers, and then coordinating these times with raster beam positions. Furthermore, since increasing the touch force would in general increase the area of contact between the sheets, and hence increase the duration and number of output signals associated with each touch, the system could discriminate different levels of force.

Turning to FIG. 2, CRT raster beam 13 is shown impinging on the front surface of CRT 20 with light rays 21 from the phosphorescent surface passing through the parallel surfaces of device 10 and into membrane 11. Some light rays (not shown) are transmitted outward toward the user and some are reflected back toward the CRT screen. Because of the air gap 30 between the lower surface of flexible membrane 11 and outer surface 14 of device 10 the reflected light rays (as will be discussed) have an angle of refraction less than the critical angle needed for total internal reflection and thus pass through device 10. These light rays, as the approach the edge of device 10, can never assume an angle sufficient to become trapped between surfaces 14 and 15 and thus whatever light approaches the edge of the device, passes into a light absorbing surface such as surface 102 which may be black plastic matte. Very little additional light impinges upon photodiode 101 and thus the output signal reflects internally scattered light.

In FIG. 3, a finger is shown applying pressure at a point on the top surface of membrane 11 thereby flexing the membrane into contact with surface 14 of device 10. Air is thus removed between membrane 11 and top surface 14 of screen 10 at a point directly under the point of pressure contact. Membrane 11 has coated thereon a surface 12 which is made up, in one embodiment, of halftone white dots to have increased reflectance and to scatter the light rays.

With the membrane depressed light generated on the surface of CRT 20 near the depression passes through device 10 and into membrane 11 and is then reflected back into device 10. These reflected light rays, since they do not now pass through air, do not refract as they did in FIG. 2 (as will be discussed) and thus some of these rays become trapped between surfaces 14 and 15 of device 10 by total internal reflection.

This trapped light then travels, as shown, within device 10 and impinges upon photodiode 101. Note that light absorbers 102 are ineffective to absorb this light since the light rays do not pass through surfaces 14 and 15. Thus, the light rays which impinge upon photodiode 101 cause an output signal which is different from the output signal generated when light does not impinge upon the photodiode.

It is important to note that photodiode 101 may be any type of device for converting optical or other signals to electrical energy and may be a single device or may comprise a number of individual devices. In some applications a device at one surface would be sufficient while in other applications it would be advantageous to surround device 10 on all sides with such a transducer which, of course, may have a single output or multiple outputs.

To make the device more useful, the sides of the white dots facing away from the CRT should be made matte black. This increases the contrast of the CRT image as viewed by the user, which would otherwise be degraded by reflection of ambient light from the dots. The darkening may be done by a variety of means; for example oxidizing the exposed surfaces, or by photoetching the dots from a combined layer of white and dark material. Such contrast enhancement by overlaying matte black dots, would be useful for any CRT, even without the touch screen described here.

Total Internal Reflection Criteria

Refraction at a single surface between media of refraction index $N_1$ and $N_2$ is shown in FIG. 4. Light ray A is perpendicular to the boundary and does not undergo refraction. Light ray B enters the boundary with an angle $\theta_1$ and is refracted according to Snell's law which states $$N_1 \sin \theta_1 = N_2 \sin \theta_2. \quad (1)$$

Light ray C approaches the boundary angle $\theta_C$ which is the critical angle for total internal reflection. This critical angle, when $N_2 = 1$, which is the case for air, is shown by the formula $$\sin \theta_C = N_2/N_1 = 1/N_1 \text{ when } N_2 = 1 \text{ (air)}. \quad (2)$$

Total internal reflection takes place when $\theta$ is larger than the critical angle such that $\theta_D$ is greater than $\theta_C$. Since sin of $\theta$ is less than 1 it follows that $N_2$ must be less than $N_1$ for total internal reflection to take place.

Figure 5:
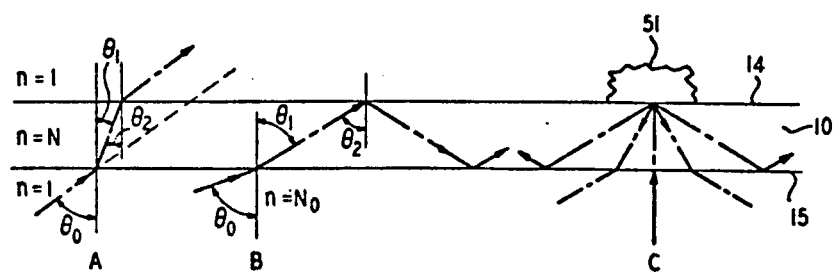
Figure 6:
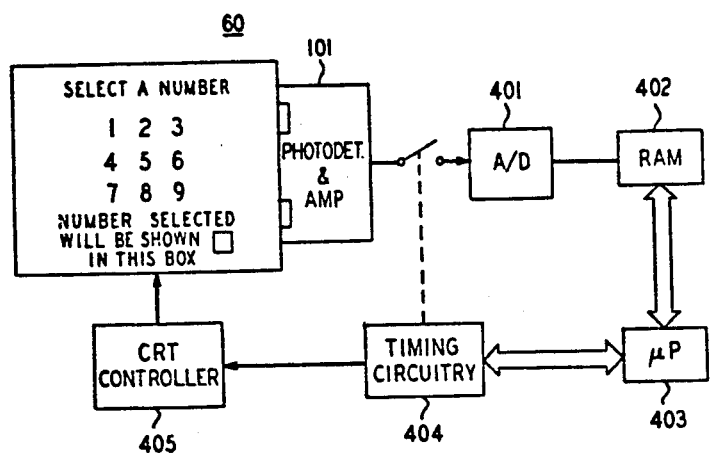
FIG. 6 shows a block diagram of an operational system.

Turning now to FIG. 5, the conditions for total internal reflection (TIF) will be reviewed with respect to a device of refractive index N with air (refractive index = 1) at the surfaces of the device. When light ray A enters device 10 from air total internal refraction cannot take place because the index of refraction at the lower surface bends the light ray to an angle smaller than the critical angle necessary for total internal refraction which is 1/N. This follows from use of geometry and Snell's law since $$\sin \theta_2 = \sin \theta_1 = \sin \theta_0 / N \quad (3)$$

and sin $\theta$ is less than 1 for all $\theta$.

In the case of light ray B (FIG. 5) the air space is eliminated when the light ray is assumed to enter from a medium with an index of refraction $N_0 > 1$ which occurs when another body is in contact with the bottom surface of device 10. Total internal reflection can now take place (where air borders the device) because the light ray is no longer bent to an angle smaller than the critical angle at the lower surface. This follows from the fact that $$\sin \theta_2 = \sin \theta_1 = (N_0/N) \sin \theta_0 \quad (4)$$

which is greater than the critical angle 1/N when $$N_0 \sin \theta_0 > 1. \quad (5)$$

When the air space is eliminated on the top surface of device 10 as shown by light ray C hitting diffusely reflecting medium 51 light enters the device from diffuse reflection at top surface 14. In this case, there is no refraction to bend the light ray below the critical angle, so total internal reflection can occur.

Conclusion

Figure 8:
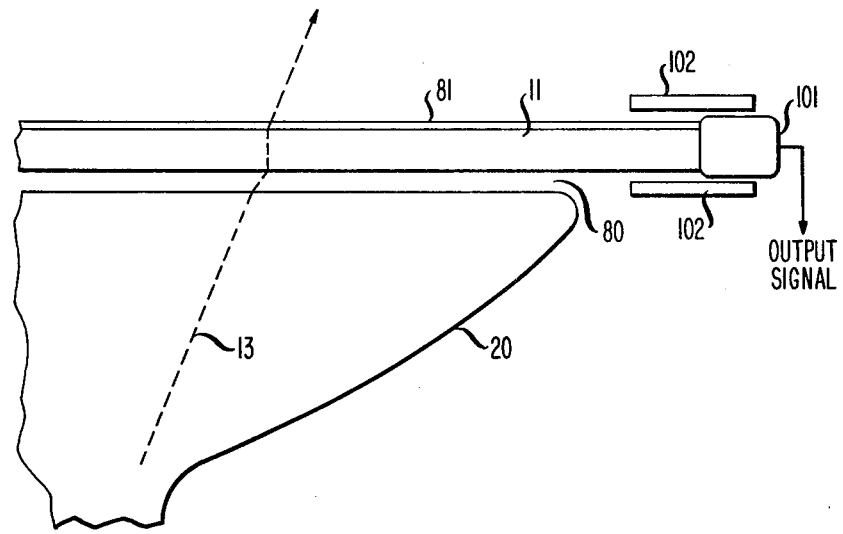
FIGS. 8 and 9 show a flexible structure having signal detectors communicating therewith.
Figure 9:
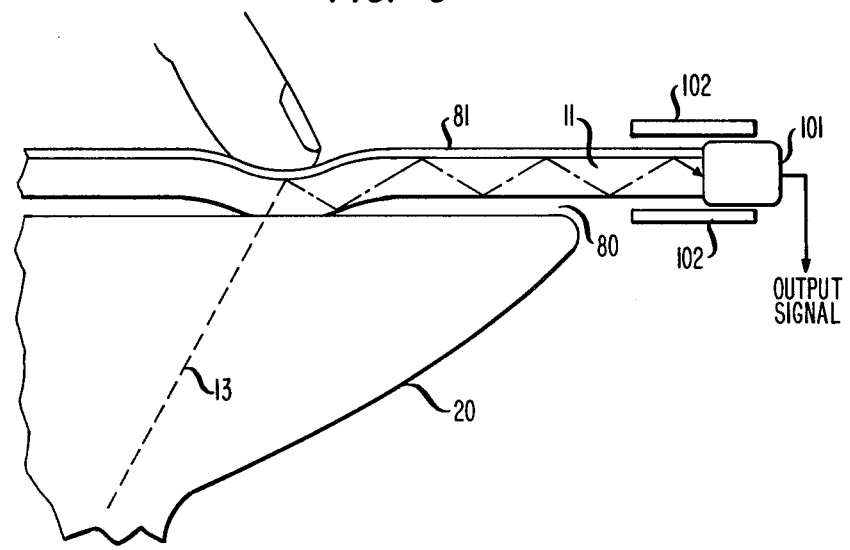

While the focus of the disclosure is on a CRT type light signal my invention may also find use in situations where it is desired to position a part in a particular location. In such an arrangement a fixed light source may be used at the desired location and the part moved mechanically or otherwise to make contact with the flexible membrane. When the contact is at the location where the light is focused total internal reflection will occur. This total internal reflection will become visible to a person observing the device. Thus my device may be useful for determining a surface condition of a screen or other device. The device can also be constructed, as shown in FIGS. 8 and 9 using the flexible membrane alone, with photodiodes 101 coupled to its edge. If this membrane is positioned near the CRT face, but separated by an air gap 80 (FIG. 8), light 13 from the CRT will pass through the sheet without reaching the diodes. But if the membrane is flexed into contact with the CRT face at a point, as shown in FIG. 9, some light rays from the CRT will become entrapped, impinge upon the photodiode 101, and cause an output signal which can be used as before for determining position. To improve this device, a second membrane 81 having a smaller refractive index and partially light absorbent can be overlaid on the first membrane. Light will still be entrapped in the first membrane but the effect of oil and other contamination on the outer surface of the device will be reduced.

Also it is understood that the signals may be light or may be electronic so long as they obey the physical phenomenon described. It, of course, is to be understood that those skilled in the art may find many applications and modifications using my invention and it may be built as a separate device for mating with an existing CRT or it may be manufactured as a part of the implosion screen itself. Also, the trapped light may be removed from the device by any light utilization device, such as, for example, fiber optics or light pipes.

Using my invention in graphics and taking advantage of the fact that multiple positions can be detected, a user could rotate a shape by touching two points and rotating them around each other. A user could position a line by simultaneously positioning its endpoints; or could specify a quadratic curve by indicating three points along its length. Areas could be colored or shaded by touching them while pads indicating these attributes were simultaneously touched.

In text processing, a screen with relabelable keys could provide a shift button that could be pressed simultaneously with other keys. A text editor could combine cursor control and touch sensitive buttons on the same screen; and the buttons could be touched while the cursor was moved (to change the text font for example).

My screen can also be made to discriminate different levels of force. In graphics, this force discrimination could indicate a degree of shading, or could be translated into linear or rotational velocity.

Force discrimination could also be used to eliminate the effect of parallax; as cursor position could be indicated on the screen as the user moved his or her finger across the display, and the user could simply press harder when the desired position was obtained. It would also be advantageous to make the flexible overlay translucent, and to focus an image upon it by means of projection television from the rear. This would given a large area screen and the focusing would lead to the finest spatial resolution.

I claim:

1. A touch position sensitive device for use in conjunction with a signal source, said device comprising
    spaced apart surfaces arranged such that signals are introduced by total internal reflection between said surfaces as a result of a change in medium bounding at least one of said surfaces, and
    a flexible overlay adjacent said one surface, said overlay adapted to be deflected into contact with said one surface in response to a depression of said overlay so as to cause said medium change thereby providing a distinctive signal level change between the surfaces of said device when said signals are introduced between said surfaces.

2. The invention set forth in claim 1 wherein a portion of said signals pass through said surfaces as well as through said overlay.

3. The invention set forth in claim 2 wherein said surfaces are substantially parallel to each other.

4. The invention set forth in claim 1 wherein said distinctive signal is provided by signal utilization means communicating with an edge of said device.

5. The invention set forth in claim 4 wherein said signal source is a light source and wherein said signals which are introduced into said device are light signals from said light source.

6. The invention set forth in claim 4 wherein said utilization means includes at least one light detecting diode.

7. The invention set forth in claim 4 wherein said utilization means includes optic fiber means.

8. The invention set forth in claim 1 wherein said flexible overlay has thereon a pattern of reflective material and wherein said overlay is at least partially transparent to said signal.

9. A position sensitive device for use in conjunction with a source of light, said device comprising
substantially parallel surfaces arranged such that light from said light source impinging upon one of said surfaces is subject to a changeable light ray angle within said surfaces due to a change in the medium bounding said one surface, and
a membrane overlayed on one of said surfaces, said overlay adapted for changing said light ray angle.

10. The invention set forth in claim 9 further comprising
light utilization means arranged to provide a distinctive output only when said impinging light is subjected to said changed angle so as to become entrapped within said device by total internal reflection between said surfaces of said device.

11. The invention set forth in claim 10 wherein a portion of said impinging light passes through said parallel surfaces and through said membrane.

12. The invention set forth in claim 11 wherein said utilization means includes at least one light detecting diode.

13. The invention set forth in claim 11 wherein said utilization means includes optic fiber means.

14. The invention set forth in claim 9 wherein said flexible overlay has thereon a pattern of reflective material and wherein said overlay is at least partially transparent to said synchronized signal.

15. A touch position sensitive device adapted for mating with the screen of a CRT operable for generating light patterns on the surface thereof, said light patterns being coordinately positioned under control of repetitive vertical and horizontal inputs, said device comprising
a rigid sheet of transparent material having inner and outer surfaces substantially parallel to each other through which light from a mated CRT screen passes, said inner surface shaped to mate with said CRT, said outer surface being open to air,
a flexible membrane overlayed on said outer surface, said membrane spaced apart from said outer surface,
light accepting means arranged along at least one edge of said device, said accepting means arranged for providing outputs indicative of the magnitude of the light impinging on said accepting means, and
means for positioning said accepting means so that light which impinges thereupon comes substantially from within said device between said parallel surfaces, and so that when the air bounding said outer surface of said rigid sheet is removed at a point on said outer surface by contact with said membrane said outputs reflect such contact for a period of time corresponding to the time when said light is being generated at said position where said contact is made.

16. A device for use in combination with the screen of a CRT, said CRT operable for generating light images on the screen thereof, said light images occurring as a result of a horizontal and vertical scan of an electron beam directed against said screen said device including
a first sheet of material having inner and outer parallel surfaces through which light generated at said CRT screen will pass with a refraction angle $\theta 1$ at said inner surface next to said CRT screen and with a refraction angle $\theta 2$ at said outer surface,
a flexible membrane overlaying said outer surface,
photodetecting means arranged along at least one edge of said device and operable for providing an output representative of the magnitude of light which impinges on said photodetecting means, and
means for positioning said photodetecting means such that said impinging light comes substantially from between said surfaces of said first sheet and such that when said refraction angle $\theta 2$ is changed to refraction angle $\theta 3$ by contact between said membrane and said outersurface said photodetector means output reflects said angle change, said refraction angle $\theta 3$ being such that total internal reflection occurs.

17. A CRT having a touch position sensitive total internally reflective screen, said screen comprising
substantially parallel surfaces arranged such that light is introduced between said surfaces as a result of a change in medium bounding an outer one of said surfaces,
a flexible overlay supportable adjacent to said outer surface, said overlay adapted to be deflected into contact with said outer surface in response to a depression of said overlay at position, said contact causing total internal reflection to occur within said parallel surfaces,
light detecting means arranged to provide a distinctive output when said light is introduced between said surfaces so as to become entrapped within said screen by total internal reflection of said surfaces of said screen.

18. The invention set forth in claim 17 further comprising
means for coordinating the position of said light across said screen with said distinctive output to determine said position on said surface corresponding to said depression.

19. The invention set forth in claim 17 wherein said flexible ovelay has displaced thereon a pattern of reflective material and wherein said overlay is at least partially transparent to said synchronized signal.

20. The invention set forth in claim 19 wherein said reflective material consists of periodically spaced apart half-tone white dots.

21. The invention set forth in claim 20 wherein the sides of said white dots facing away from said CRT are made dark in color.

22. A touch sensitive device for use in conjunction with a light source, said device comprising
    spaced apart flexible surfaces arranged such that signals are introduced between said surfaces so as to become entrapped within said surfaces by total internal reflection between said surfaces as a result of a change in medium bounding at least one of said surfaces, said medium change occurring as a result of a flexed contact between said one surface and said light source, and
    signal utilization means communicating with a region between said surfaces so as to provide a distinctive output when said signals are so introduced between said surfaces.

23. The invention set forth in claim 22 further comprising a flexible overlay adjacent to one of said surfaces, said overlay having a smaller index of refraction than said flexible surface.

24. The invention set forth in claim 23 wherein said overlay is partially light absorbent.

25. Deflection detection apparatus for use with a signal source, said apparatus comprising
    a structure having spaced apart surfaces such that signals from said signal source are introduced by total internal reflection between said surfaces, and
    means adjacent one of said surfaces adapted for deflection into contact with said one surface so as to cause said introduction of signals between said surfaces by total internal reflection.

26. The invention set forth in claim 25 wherein said deflection means is a flexible membrane overlaid on said one surface and spaced apart therefrom.

27. A touch sensitive device for use in conjunction with a light source, said device comprising
    spaced apart flexible surfaces arranged such that signals are introduced between said surfaces so as to become entrapped within said surfaces by total internal reflection between said surfaces as a result of a flexure of at least one of said surfaces, and
    signal utilization means communicating with a region between said surfaces so as to provide a distinctive output when said signals are so introduced between said surfaces.

28. A touch position sensitive device adapted for mating with the screen of a CRT operable for generating light patterns on the surface thereof, said light patterns being coordinately positioned under control of repetitive vertical and horizontal inputs, said device comprising
    a flexible sheet of transparent material having inner and outer surfaces substantially parallel to each other through which light from a mated CRT screen passes, said inner surface shaped to mate with said CRT, and
    light accepting means arranged for providing outputs indicative of the magnitude of the light impinging on said accepting means, said accepting means positioned so that light which impinges thereupon comes substantially from within said device between said parallel surfaces, and so that when said sheet of material is flexed to allow light to become entrapped within said material by total internal reflection said outputs reflect such flexure for a period of time corresponding to the time when said light is being generated at said position where said flexure occurs.

29. Deflection detection apparatus for use with a signal source, said apparatus comprising
    a flexible structure having spaced apart surfaces such that signals from said signal source are introduced by total internal reflection between said surfaces as a result of a flexure of said structure.

30. Deflection detection apparatus comprising, in combination, a signal source, and
    a flexible structure having spaced apart surfaces such that signals from said signal source are introduced by total internal reflection between said surfaces, as a result of a flexure of said structure.

* * * * *

REEXAMINATION CERTIFICATE (1026th)
United States Patent [19]
Kasday

[11] B1 4,484,179

[45] Certificate Issued  Mar. 28, 1989

[54] TOUCH POSITION SENSITIVE SURFACE

[75] Inventor: Leonard R. Kasday, Plainsboro, N.J.

[73] Assignee: AT&T Bell Laboratories, Murray Hill, N.J.

Reexamination Request:
No. 90/001,251, Jun. 1, 1987

Reexamination Certificate for:
Patent No.: 4,484,179
Issued: Nov. 20, 1984
Appl. No.: 333,744
Filed: Dec. 23, 1981

Related U.S. Application Data

[63] Continuation of Ser. No. 140,715, Apr. 16, 1980, abandoned.

[51] Int. Cl.⁴ .................. H03M 1/32; H04L 23/02
[52] U.S. Cl. .................. 340/365 P; 178/18; 250/549; 340/712
[58] Field of Search ............... 340/365 P, 712

[56] References Cited
U.S. PATENT DOCUMENTS 3,673,327   6/1972   Johnson et al. ............... 340/712
3,707,715  12/1972   Perotto ....................... 340/365 P
4,254,333   3/1981   Bergstrom ..................... 250/221

FOREIGN PATENT DOCUMENTS 2485804  12/1981  France .

*Primary Examiner*—David L. Trafton

[57] ABSTRACT

A touch sensitive device is arranged with substantially parallel surfaces which are at least partially transparent to light. A flexible membrane is supported above the top surface of the screen and when the overlay is flexed into contact with the screen, light which had passed through the screen, is trapped between the screen surfaces by total internal reflection. The edges of the screen are fitted with light detectors for gathering the trapped light. Using this arrangement positional determination of one or more screen touches is possible.

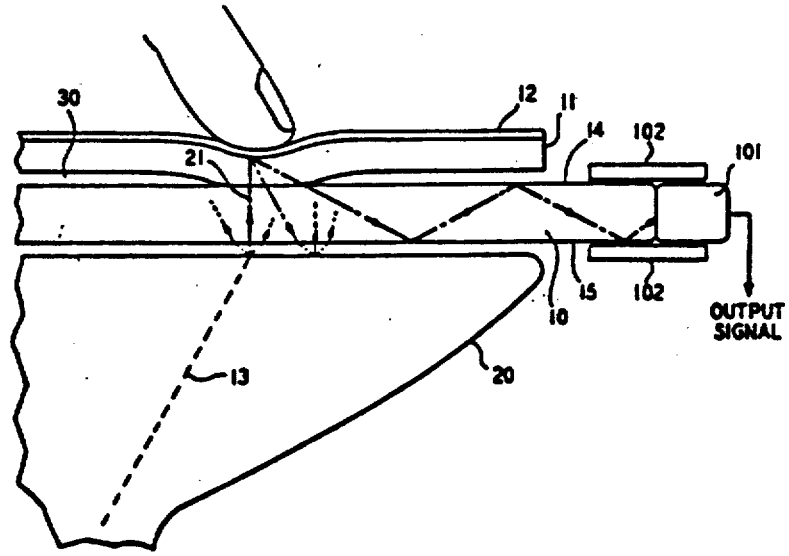

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 22-24 and 27-30 is confirmed.

Claims 20 and 21 are cancelled.

Claims 1, 9, 15-17 and 25 are determined to be patentable as amended.

Claims 2-8, 10-14, 18, 19 and 26, dependent on an amended claim, are determined to be patentable.

New claims 31 and 32 are added and determined to be patentable.

1. A touch position sensitive device for use in conjunction with a signal source, said device comprising
spaced apart surfaces arranged such that signals are introduced by total internal reflection between said surfaces as a result of a change in medium bounding at least one of said surfaces and
a flexible overlay adjacent *to* said one surface *and substantially coextensive therewith*, said overlay *spaced apart from said one surface and* adapted to be deflected into contact with said one surface in response to a depression of said overlay so as to cause said medium change thereby providing a distinctive signal level change between the surfaces of said device when said signals are introduced between said surfaces.

9. A position sensitive device for use in conjunction with a source of light, said device comprising
substantially parallel surfaces arranged such that light from said light source impinging upon one of said surfaces is subject to a changeable light ray angle within said surfaces due to a change in the medium bounding said one surface, and
a membrane overlayed on one of said surfaces *and substantially coextensive therewith*, said overlay *spaced apart from said one of said surfaces and* adapted for changing said light ray angle.

15. A touch position sensitive device adapted for mating with the screen of a CRT operable for generating light patterns on the surface thereof, said light patterns being coordinately positioned under control of repetitive vertical and horizontal inputs, said device comprising
a rigid sheet of transparent material having inner and outer surfaces substantially parallel to each other through which light from a mated CRT screen passes, said inner surface shaped to mate with said CRT, said outer surface being open to air,
a flexible membrane overlayed on said outer surface *and substantially coextensive therewith*, said membrane spaced apart from said outer surface,
light accepting means arranged along at least one edge of said device, said accepting means arranged for providing outputs indicative of the magnitude of the light impinging on said accepting means, and
means for positioning said accepting means so that light which impinges thereupon comes substantially from within said device between said parallel surfaces, and so that when the air bounding said outer surface of said rigid sheet is removed at a point on said outer surface by contact with said membrane said outputs reflect such contact for a period of time corresponding to the time when said light is being generated at said position where said contact is made.

16. A device for use in combination with the screen of a CRT, said CRT operable for generating light images on the screen thereof, said light images occurring as a result of a horizontal and vertical scan of an electron beam directed against said screen, said device including
a first sheet of material having inner and outer parallel surfaces through which light generated at said CRT screen will pass with a refraction angle $\theta 1$ at said inner surface next to said CRT screen and with a refraction angle $\theta 2$ at said outer surface,
a flexible membrane overlaying said outer surface *and substantially coextensive therewith, said overlay spaced apart from said outer surface,*
photodetecting means arranged along at least one edge of said device and operable for providing an output representative of the magnitude of light which impinges on said photodetecting means, and
means for positioning said photodetecting means such that said impinging light comes substantially from between said surfaces of said first sheet and such that, when said refraction angle $\theta 2$ is changed to refraction angle $\theta 3$ by contact between said membrane and said outersurface, said photodetector means output reflects said angle change, said refraction angle $\theta 3$ being such that total internal reflection occurs.

17. A CRT having a touch position sensitive [total internally reflective screen,] *screen operative by total reflection,* said screen comprising substantially parallel surfaces arranged such that light is introduced between said surfaces as a result of a change in medium bounding an outer one of said surfaces,
a flexible overlay supportable adjacent to *and substantially coextensive with* said outer surface, said overlay *spaced apart from said outer surface and* adapted to be deflected into contact with said outer surface in response to a depression of said overlay at *a* position, said contact causing total internal reflection to occur within said parallel surfaces,
light detecting means arranged to provide a distinctive output when said light is introduced between said surfaces so as to become entrapped within said screen by total internal reflection of said surfaces of said screen.

25. Deflection detection apparatus for use with a signal source, said apparatus comprising
a structure having spaced apart surfaces such that signals from said signal source are introduced by total internal reflection between said surfaces, and
means adjacent *to, spaced apart from, and substantially coextensive with* one of said surfaces adapted for deflection into contact with said one surface so as to cause said introduction of signals between said surfaces by total internal reflection.

*31. A CRT having a touch position sensitive total internally reflective screen, said screen comprising*

*substantially parallel surfaces arranged such that light is introduced between said surfaces as a result of a change in medium bounding an outer one of said surfaces,*

*a flexible overlay supportable adjacent to said outer surface, said overlay adapted to be deflected into contact with said outer surface in response to a depression of said overlay at position, said contact causing total internal reflection to occur within said parallel surfaces,*

*light detecting means arranged to provide a distinctive output when said light is introduced between said surfaces so as to become entrapped within said screen by total internal reflection of said surfaces of said screen and wherein said flexible overlay has displaced thereon a pattern of reflective material and wherein said overlay is at least partially transparent to said synchronized signal and wherein said reflective material consists of periodically spaced apart half-tone white dots.*

*32. The invention set forth in claim 31 wherein the sides of said white dots facing away from said CRT are made dark in color.*

* * * * *